United States Patent
Azizi et al.

(10) Patent No.: US 8,275,135 B2
(45) Date of Patent: Sep. 25, 2012

(54) LOUDNESS ADJUSTMENT WITH SELF-ADAPTIVE GAIN OFFSETS

(75) Inventors: Seyed-Ali Azizi, München (DE); Wolfgang Hess, Karlsbad (DE); Michael Zeller, Karlsbad (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 715 days.

(21) Appl. No.: 12/403,306

(22) Filed: Mar. 12, 2009

(65) Prior Publication Data

US 2009/0232320 A1 Sep. 17, 2009

(30) Foreign Application Priority Data

Mar. 12, 2008 (EP) .................................... 08004557

(51) Int. Cl.
*H03G 3/20* (2006.01)
(52) U.S. Cl. ............................ 381/57; 381/104; 381/107
(58) Field of Classification Search .................... 381/57, 381/104, 107
See application file for complete search history.

(56) References Cited

U.S. PATENT DOCUMENTS

| | | | |
|---|---|---|---|
| 6,360,187 B1 * | 3/2002 | Hermann | 702/191 |
| 2002/0072341 A1 * | 6/2002 | Ricard et al. | 455/174.1 |
| 2004/0101145 A1 * | 5/2004 | Falcon | 381/64 |
| 2005/0089177 A1 * | 4/2005 | Hughes et al. | 381/86 |
| 2006/0123081 A1 | 6/2006 | Baudino et al. | |
| 2007/0053513 A1 * | 3/2007 | Hoffberg | 380/201 |

FOREIGN PATENT DOCUMENTS

| | | |
|---|---|---|
| EP | 1821572 A1 | 8/2007 |
| JP | 07142946 | 6/1995 |

* cited by examiner

*Primary Examiner* — Benjamin Sandvik
(74) *Attorney, Agent, or Firm* — The Eclipse Group LLP

(57) ABSTRACT

A method for adjusting a loudness of an announcement sound signal relative to a loudness of an entertainment sound signal, the method including the steps of determining the loudness of the entertainment sound signal, and adjusting the loudness of the announcement sound signal relative to the entertainment sound signal by determining a self-adaptive gain offset of the announcement sound signal relative to the entertainment sound signal, the self-adaptive gain offset adapting to the auditory perception of a user to which the entertainment sound signal and the announcement sound signal are output.

21 Claims, 4 Drawing Sheets

FIG. 3a

| VOL.<br>INDEX | 1 | 2 | 3 | ... |
|---|---|---|---|---|
| α | $a_{m1}$ | $a_{m2}$ | $a_{m3}$ | |
| β | $b_{m1}$ | $b_{m2}$ | $b_{m3}$ | |
| γ | | | | |

| VOL.<br>INDEX | 1 | 2 | 3 |
|---|---|---|---|
| α | $a_{s1}$ | $a_{s2}$ | $a_{s3}$ |
| β | $b_{s1}$ | $b_{s2}$ | $b_{s3}$ |
| γ | | | |

304

LOUDNESS ADJUSTMENT WITH SELF-ADAPTIVE GAIN OFFSETS

RELATED APPLICATIONS

This application claims priority of European Patent Application Serial Number 08 004 557.8, filed on Mar. 12, 2008, titled LOUDNESS ADJUSTMENT WITH SELF-ADAPTIVE GAIN OFFSETS, which application is incorporated in its entirety by reference in this application.

BACKGROUND OF THE INVENTION

1. Field of the Invention

This invention relates to a method for adjusting a loudness of an announcement sound signal relative to a loudness of an entertainment sound signal. The invention finds especially, but not exclusively, application in vehicles in which sound systems are present emitting an entertainment sound signal. Furthermore, a main control unit may be provided emitting an announcement signal, e.g., of a navigation system indicating the route to the driver.

2. Related Art

Motor vehicle navigation systems are known in the art and are proliferating. A navigation system calculates a route from the present location to a destination and shows on a display the next maneuvers to be taken by the driver. Additionally, it is possible that the driver is supported by an announcement indicating to the driver how to behave at an upcoming location. By way of example, the navigation system may alert the driver to turn right at the next corner.

In addition to this announcement sound signal, another sound source, such as a radio or a compact disc, a DVD or other digitally stored music stored as an MP3 file etc. might be utilized in the vehicle during driving. In case of an announcement by the navigation system, the announcement sound signal is output together with the sound signal of the other sound source, which, for purposes of this application, shall be referred to as an "entertainment sound signal." In this situation, it may happen that the sound level of the announcement sound signal relative to the sound level of the entertainment sound signal is chosen in such a way that the content of the announcement may not be correctly understood by the driver as the signal level difference between the two signals may be too low.

In EP 1 821 572, a system for adapting the loudness of the entertainment sound signal relative to the announcement sound signal is disclosed. In this prior art, differentiation between the sound event in the physical domain and the auditory event relating to the human perception is made.

The sound pressure level (SPL) is a physical measure and is mathematically converted to decibel (dB). For an orally adequate rating, a weighting function is introduced. Sound events are perceived by humans not proportional to their physical sound pressure level. Depending on temporal and spectral masking, frequency and overall sound pressure level, the loudness of the auditory event differs from the SPL of the sound event. In EP 1 821 572, a fixed announcement gain offset is calculated, this announcement gain offset depends on the volume level set by the user and on a mean loudness determined by the system. This gain offset is a fixed value.

The auditory perception of a human being, however, depends on the age and on the individual function of the hearing. The auditory perception differs to a great extend for different users and is normally not linear. By way of example, if one's hearing is damaged, a small loudness difference is difficult to perceive, whereas above certain thresholds the damaged person's hearing corresponds to the hearing of a person with normal hearing. Additionally, the surrounding noise such as the noise of a motor in a vehicle, the noise of the tires, the noise of an open window etc. change the binaural intelligibility level difference (BILD). As a consequence, the auditory perception strongly depends on the user utilizing the audio source outputting the entertainment sound signal and the announcement sound signal. Accordingly, a need exists to improve the loudness perception based upon different hearing capabilities of a user of the audio system.

SUMMARY

A method is provided for adjusting the loudness of the announcement sound signal relative to the loudness of the entertainment sound signal. In one step, the loudness of the entertainment sound signal is determined. In an additional step, the loudness of the announcement sound signal is adjusted relative to the loudness of the entertainment sound signal by automatically determining a self-adaptive gain offset of the announcement sound signal relative to the entertainment sound signal.

A sound signal adjusting system is also provided that is configured to adjust the loudness of the announcement sound signal relative to the loudness of the entertainment sound signal. The system includes an entertainment loudness determination unit to determine the loudness of the entertainment sound signal. A gain offset determination unit is provided to determine the self-adaptive gain offset of the announcement sound signal relative to the entertainment sound signal. Additionally, an auditory perception determination unit is provided to determine the auditory perception of the user of the system, the self-adaptive gain offset determination unit adapting the self-adaptive gain offsets in accordance with the determined auditory perception. The auditory perception determination unit takes into account the corrections made to the volume level when the announcement is output in the presence of the entertainment sound signal. The sound signal adjusting system learns from the volume settings made by the user when an announcement is made by an audio system while an entertainment sound signal is present.

In another example of an implementation of the invention, two different gain offset determination units are provided: an announcement gain determination unit and an entertainment gain determination unit. Both determination units can use the self-adaptive gain offset values. However, it is also possible that only one of the gain determination units uses the self-adapting gain offset values, the other using non-adapting constant gain offset values. The gain offset determination units may comprise gain offset tables containing the self-adaptive gain offset values in dependence on the loudness of the entertainment sound signal and in dependence on the volume level set by the user. With regard to the gain offset tables provided, two tables may be provided, one table having the self-adaptive offset values for music content, and the other table having the self-adaptive gain offset values for the speech content. In the same way, two different announcement gain offset tables may be provided, one for the speech content of the entertainment signal and one for a music content of the entertainment signal.

The auditory perception determination unit may include an artificial neural network to determine the self-adaptive gain offset values. The neural network receives as an input, the corrections made by the user and outputting the adapted gain offset values. To differentiate between speech content and music content, a content recognition unit may be provided differentiating between music content and speech content.

In yet another aspect of the invention, gain offset determination units are provided that include gain offset tables containing the self-adaptive gain offset values depending on the loudness of the entertainment signal and depending on the volume level set by the user. The self-adaptive gain offsets adapt to the auditory perception of the user and may include an entertainment gain offset table for speech content, an entertainment gain offset table for music content, an announcement gain offset table for a speech content and an announcement gain offset table for music content.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

FIG. 3a schematically shows one example of a gain offset table for a music component of the entertainment signal.

FIG. 3b schematically shows one example of a gain offset table for a sound component of the entertainment signal.

DETAILED DESCRIPTION

Figure 1:
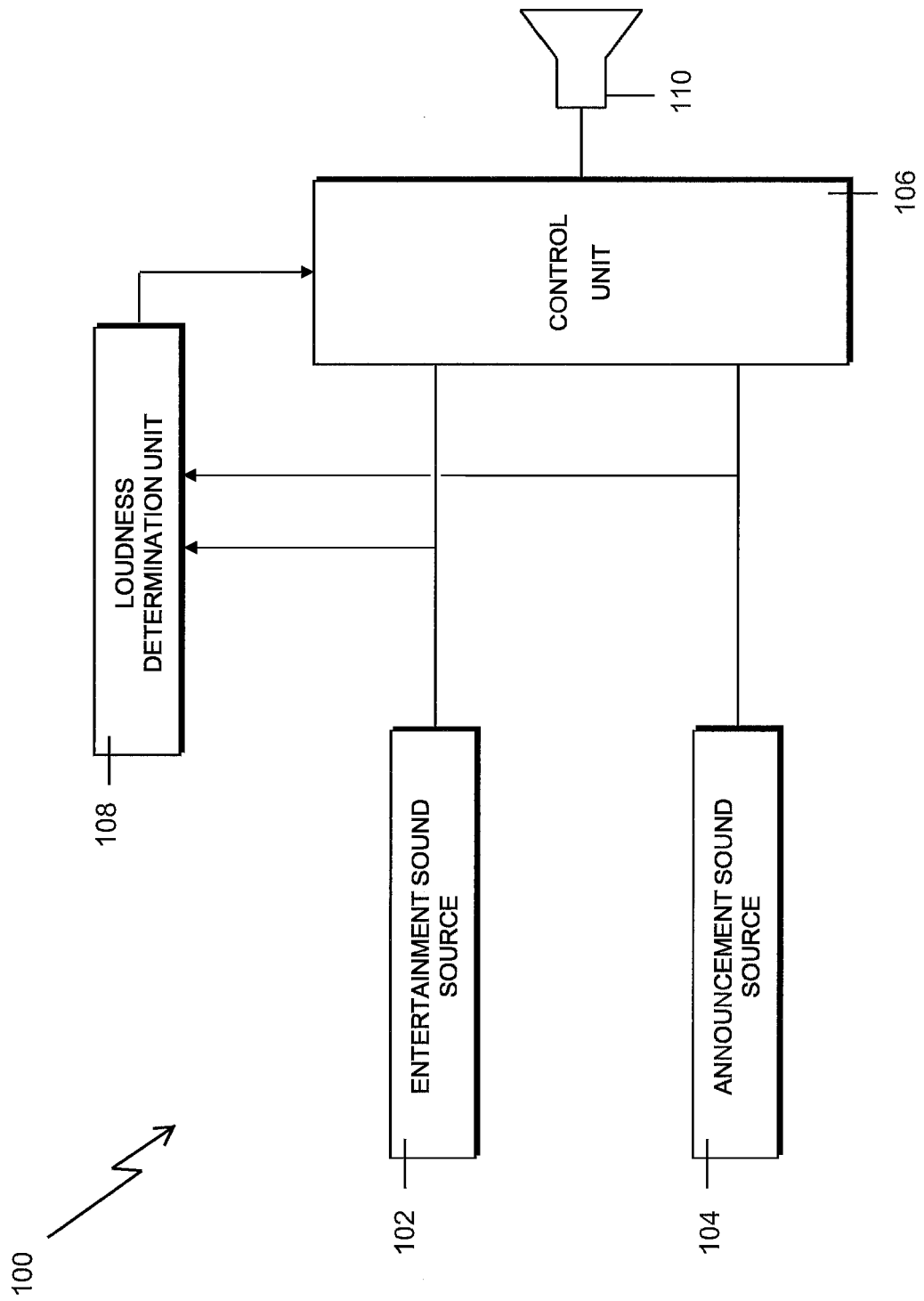
FIG. 1 is a schematic view of a sound system incorporating features of the invention.

In FIG. 1, a schematic view of a sound system 100 including an entertainment sound source 102 and an announcement sound source 104 is shown. The entertainment sound source 102 can be an MP3 player, a CD player, a DVD player, a radio signal etc. The announcement sound source 104 may, for example, be part of a navigation system announcing guiding maneuvers to the user. Furthermore, a loudness determination unit 108 is provided to determine the loudness of the signal from the entertainment sound source 102. Additionally, the loudness determination unit 108 may also determine the loudness of the signal from the announcement sound source 104. A psychoacoustic model of the human hearing can be utilized in the loudness determination unit 108 to convert the measured sound pressure levels into a loudness or measured value for loudness. A control unit 106 is provided to control the output of the two sound sources 102 and 104 via one or more loudspeakers 110.

During use, the entertainment sound is continuously output following user preferences. In case an announcement should be output, the loudness of the entertainment sound signal is adjusted to the loudness of the announcement sound signal in such a way that the announcement information is clearly perceivable by the user.

Figure 2:
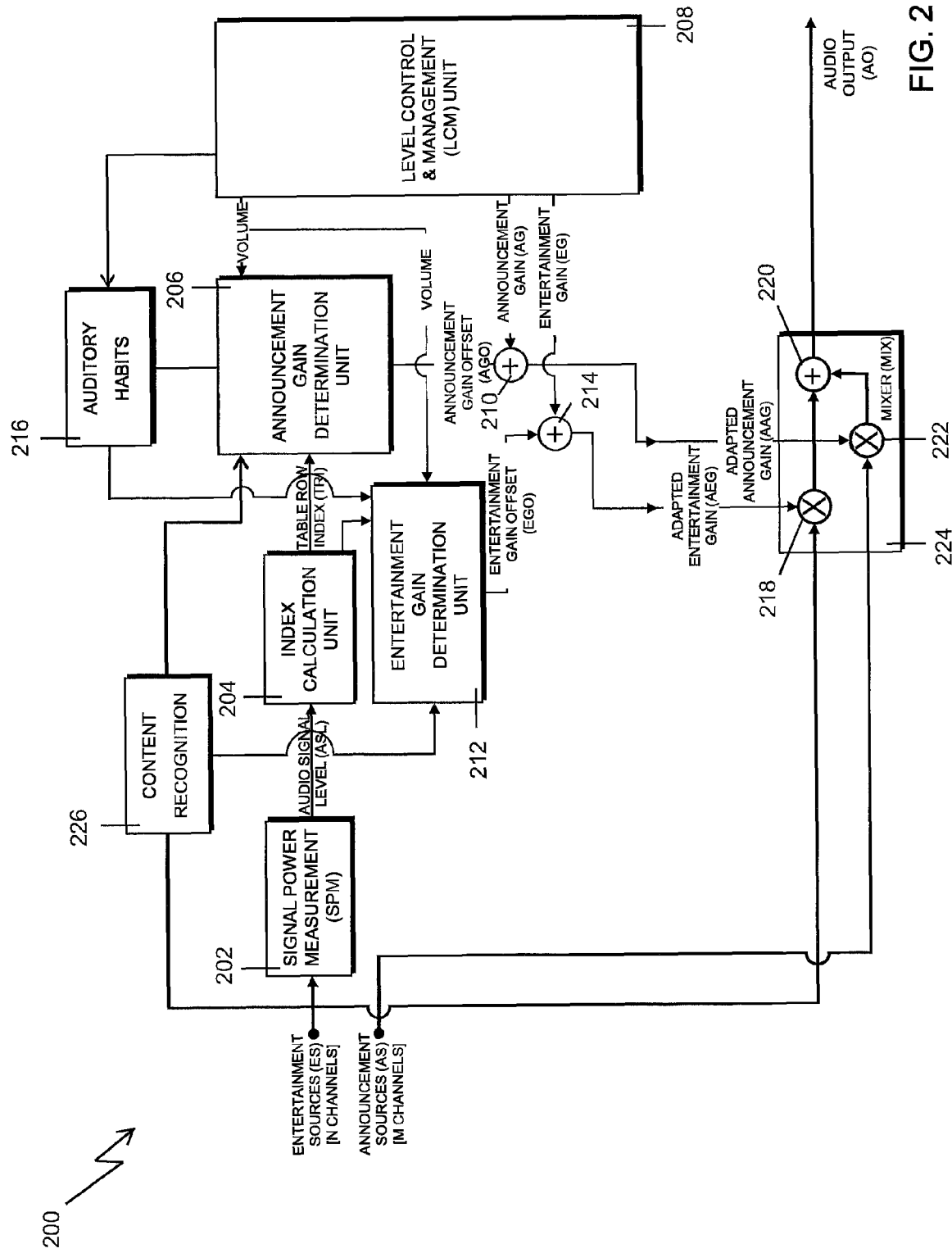
FIG. 2 is schematic view of one example of a detailed sound system taking into account the auditory habits and auditory perception of the user.

In FIG. 2, an example of a detailed system 200 for automatically adjusting the audio output is shown. As illustrated in FIG. 2, the sound signal adjusting system 200 may be configured to adjust the loudness of the announcement sound signal relative to the loudness of the entertainment sound signal. The system 200 includes a signal power measure (SPM) unit 202, an index calculation unit 204, an entertainment gain offset determination unit 212 and an announcement gain determination unit 206. Additionally, an auditory habits determination unit 216 is provided determining the auditory perception of the user of the system 200, which takes into account the corrections made to the volume level when the announcement is output in presence of the entertainment sound signal. A level control and management unit (LCM) 208 is also provided to detect and, optionally learn, from the volume settings made by the user when an announcement is made by an audio system while an entertainment sound signal is present.

As will we explained further below, both the entertainment gain and announcement gain determination units 212, 206 can use the self-adaptive gain offset values. However, it is also possible that only one of the gain determination units 212, 206 use the self-adapting gain offset values, the other using non-adapting constant gain offset values. The gain offset determination units 212, 206 may include gain offset tables, as illustrated in FIGS. 3a & 3b, containing the self-adaptive gain offset values in dependence on the loudness of the entertainment sound signal and in dependence on the volume level set by the user. As illustrated in FIGS. 3a & 3b, two entertainment gain offset tables may be provided, one having the self-adaptive offset values for music content, the other having the self-adaptive gain offset values for the speech content. In the same way, two different announcement gain offset tables may be provided, one for the speech content of the entertainment signal and one for a music content of the entertainment signal.

The auditory habits determination unit 216 may include an artificial neural network to determine the self-adaptive gain offset values. The neural network may receive, as an input, the corrections made by the user and output the adapted gain offset values. To differentiate between speech content and music content, a content recognition unit 226 may further be provided, as illustrated in FIG. 2, to differentiate between signal carrying music content and signals carrying speech content.

In operation, the entertainment sound signal, which may be provided in n different channels, is input to a signal power measurement unit 202 in which the maximum and the mean signal power of the entertainment signal is determined and in which the signal power is transferred into a loudness value based on a psychoacoustic model of the human hearing. The maximum and the mean signal power are then fed to the index calculation unit 204. In the index calculation unit 204, the signal course of the maximum and the mean power is evaluated and an average signal level is determined. The index calculation unit 204 helps to recognize whether the entertainment signal has a constant high signal level or whether the entertainment signal includes short time maximums, as it is the case, when short time beats are contained in the signal. The determined table row index TRI represents the average loudness of the entertainment signal. This average loudness value is then fed to an announcement gain determination unit 206. The announcement gain determination unit 206 additionally receives the volume as adjusted by the user using an operating element (not shown) of the system 200. A level control and management unit (LCM) 208 detects the volume level adjusted by the user on the basis of the adjusted volume. The announcement gain determination unit 206 determines an announcement gain offset (AGO). The announcement gain determination unit 206 determines the corrected announcement gain offset, which might be positive or negative, and describes a corrected announcement level.

As will be further explained below, in connection with FIGS. 3a & 3b, the announcement gain determination unit 206 may determine the announcement gain offset (AGO) based on content recognition and/or on auditory habits. This announcement gain offset may be positive or negative and describes a corrected announcement level. This announcement gain offset AGO is added to the announcement gain output from the LCM unit 208 in adder 210, resulting in an adapted announcement gain AG. The auditory habits and the content recognition may also be utilized in the entertainment gain determination unit 212 to calculate an entertainment gain offset (EGO). The entertainment gain determination unit 212 utilizes adaptive gain offset values to calculate EGO. The calculated EGO is added to the entertainment gain (EG) output from the level control & management unit 208 in adder 214. In the mixing unit 224, the adapted announcement gain (AG) is mixed to the announcement sound signal in mixer 222, whereas the adapted entertainment gain (AEG) is mixed to the entertainment source in mixer 218. Last, but not least, the signal output from the mixer 218 and 222 are added in adder 220. Normally, EGOs are determined in such a way that in case of an announcement, the entertainment signal level may be kept constant or may be lowered, whereas the AGO is determined in such a way that it has enough signal level to be correctly understood by the user.

To assisting in determining EGO and AGO, a content recognition unit 226 is provided and is configured in such a way so as to recognize the content of the entertainment sound source. The content recognition unit 226 is especially configured to differentiate between entertainment signals containing a speech component and entertainment signals containing a music component. Because speech perceptibility depends on whether the background entertainment signal is a speech signal or a music signal, utilizing a content recognition unit 226 is beneficial to the operation of the system and, in particular, to gain determination. In this regard, the information of the content of the entertainment signal is fed to the entertainment gain determination unit 212 and the announcement gain determination unit 206 to assist in determining EGO and AGO.

An auditory habits or auditory perception determination unit 216 may also be provided to assist in determining EGO and AGO. The auditory habits determination unit 216 detects the reacting of the user when an announcement source signal is output together with an entertainment source signal. It may happen that the user cannot correctly follow the announcement as the entertainment signal output, together with the announcement signal, is such that the level difference of the two signals is too small for a correct recognizability of the speech content of the announcement sound signal. As a reaction, the user may correct the sound signal output in such a way that either the volume of the entertainment is decreased and/or the volume of the announcement sound signal is increased. This user reaction is detected by the auditory habits determination unit 216. The auditory habits determination unit 216 may include an artificial neural network, artificial meaning to distinguish this neural network from natural neural networks as they occur in brains. Neural networks are a technique for processing a plurality of inputs and extracting information by recognizing patterns, which, in the present case, are the reaction patterns of the user for a certain sound situation. The auditory habits determination unit 216 receives the correction of the sound level of the user and may additionally receive the former announcement gain offset values together with the determined loudness value index TRI, as calculated by the index calculation unit 204 and outputs a new self-adaptive gain offset value replacing the former gain offset value.

In both the entertainment gain determination units 212 and the announcement gain determination units 206, may be provided with gain offset tables, containing gain offset values. In FIGS. 3a & 3b, two gain offset table are shown. FIG. 3a schematically shows one example of a gain offset table 302 for a music component of the entertainment signal, while FIG. 3b schematically shows one example of a gain offset table 304 for a sound component of the entertainment signal.

In one example of implementation, as shown in FIGS. 3a and 3b, two different gain offset tables may be provided. One table 302 may be provided for use when the content from the entertainment source is identified as music content, and one table 304 may be provided for use when the content from the entertainment signal is speech content. The tables 302, 304, as shown in FIGS. 3a and 3b, provide different index values based upon different volume levels as controlled by the user, e.g., as column indices of the table. The different rows mentioned as α β γ show the table row are the TRI index. For each volume level and for each table row index, one gain offset value is provided in the table. By way of example, when the signal is a music signal, for the TRI index α and the volume level 3, the gain offset of $a_{M3}$ is provided in the table, as illustrated in FIG. 3a. When used in connection with announcement gain determination unit 206, the announcement gain offset (AGO) is determined. Similarly, when used in connection with the entertainment gain determination unit 212, the entertainment gain offset (EGO) is determined.

In an alternative implementation, the gain offset values reflected in the tables 302, 304 may not be fixed, but may be self-adaptive based upon values determined by the auditory habits determination unit 216. In this implementation, new gain offset values are determined in the auditory habits determination unit 216 and transmitted to the announcement and gain determination units 206, 212 replacing preset gain offset values provided by the tables 302, 304. In case the entertainment sound source is a speech signal, the gain offset value of, e.g., $b_{S2}$ is used for the index TRI=β and the volume level=2. The gain offset table for speech content 302 and the gain offset table for music content 304 may be provided in each gain determination unit 206 and 212.

To correctly adjust the loudness of the announcement signal relative to the loudness of the entertainment signal, the entertainment gain determination unit 212 may also include the two tables shown in FIGS. 3a & 3b, one entertainment gain offset table for music content 302 and one entertainment gain offset table for speech content 304. As previously discussed, the announcement gain determination unit 206 also includes announcement gain offset tables for speech content and the announcement gain offset tables for music content. The offset table values of the tables in the entertainment gain determination unit 212 and the announcement gain determination unit 206 may be self-adaptive gain offset values or predetermined values. In this regard, not all tables need to contain self-adaptive values or predetermined values. For example, it is also possible that only one or two out of the four gain offset tables include self-adaptive gain offset values. Once the auditory habit determination unit 216 calculates a new gain offset value and replaces the former value by the new value, the other gain offset values in the neighborhood may also be recalculated based upon a psychoacoustic model.

As previously discussed, the self-adaptive gain offset adapts to the auditory perception of the user to which the entertainment sound signal and the announcement sound signal are output. With the use of the self-adaptive gain offsets, these gain offsets can be configured as learning gain offsets, learning to interpret the auditory perception of the user. In case an entertainment signal is output together with the announcement sound signal and the user changes the signal level of one of these signals or of both of these signals to better understand the announcement, the self-adaptive gain offsets are configured in such a way that they learn from this user-made correction. When the user has corrected the signal level of one of the two sound signals several times, it is possible to understand the auditory perception of the user and to adapt the self-adaptive gain offsets accordingly. The self-adaptive gain offsets are table values that are adapting in time as a consequence of a learning process following previously performed user volume adjustments. By way of example, for the comprehensibility of a speech signal, the signal to noise difference between the speech signal and the noise signal, here the music, increases with increasing SPL. At 70 dB, this difference can be as low as several dB, whereas at 100 dB, a signal difference of about 30 dB is necessary for the user to understand the content of the speech signal component. For a level of 70 dB and lower, the level difference between signal and noise is approximately constant and increases linearly from 70 dB to about 100 dB. The threshold of 70 dB is valid for humans with a normal hearing. In case of an older person or a person with a damaged hearing, this threshold of 70 dB changes to higher dB levels, whereas the above-said new threshold, the same linear characteristics as for a normal hearing person is valid. As a consequence, different users perceive the entertainment sound signal and the announcement sound signal in different ways. For one user, the level difference between announcement sound and entertainment sound may be high enough, whereas this is not case for another user. As a consequence, the user may adapt the volume level of the announcement sound signal by increasing this level or by lowering the volume for the entertainment sound signal to correctly perceive the information contained in the announcement sound signal. The self-adaptive gain offsets used in the present invention learn from the user correction and adapt the gain offset accordingly, i.e., the gain offset of the announcement signal, the gain offset of the entertainment signal, or both gain offsets. The self-adaptive gain offset is adapting to previously made user volume adjustments.

According to one example implementation of the invention, the self-adaptive gain offset adapts by taking into account a former gain offset value and the correction of the volume made by the user when the announcement and the entertainment sound signal were output to the user using the former gain offset value. As explained above, the self-adaptive gain offset value learns from the correction made by the user, a new gain offset value being calculated based on the former gain offset value and the reaction of the user.

In this context, the self-adaptive gain offset may be adapted by a weighting mechanism weighting different factors. One of these factors may be the correction of the volume made by the user; the former gain offset value and a psychoacoustic model of the human hearing. The psychoacoustic model of the human hearing may be utilized to determine, for example, a mean loudness of the entertainment sound signal.

As illustrated in FIGS. 3a & 3b, the self-adaptive gain offset values may be stored in gain offset tables. This table or matrix contains as one parameter the volume level set by the user and as the other parameter the determine loudness of the entertainment signal. For each of the two parameters a self-adaptive gain offset value is provided in the table.

The learning of the self-adaptive gain offset values may be achieved by using an artificial neural network. In this artificial neural network, the input variable is the correction of the user, and the output variable of the artificial neural network is the new self-adaptive gain offset value replacing the former gain offset value in the gain offset table. The self-adaptive gain offset values can also be trained using other methods apart from artificial neural networks, e.g., methods based on fuzzy logic or linear and non-linear feedback control algorithms. Artificial neural networks are able to determine the relationship between an input variable and an output variable using a model by training. With a repeated training of the artificial neural network, the relationship determined by the neural network approaches the actual existing relationship between input and output variable.

According to yet another example of an implementation, a self-adaptive announcement gain offset is calculated for the announcement sound signal and a self-adapted entertainment gain offset for the entertainment sound signal. In case of a low volume level of the entertainment sound signal, a constant announcement gain offset may be used. Above a first threshold, the announcement gain offset normally increases with increasing volume of the entertainment sound signal. The more the entertainment sound signal increases, not only the announcement sound signal is increased, but the entertainment sound signal is also lowered relative to the entertainment sound signal without the announcement. For the increase of the announcement sound signal, the self-adaptive gain offset for the announcement sound signal may be utilized. For adapting the entertainment sound signal, the self-adaptive entertainment gain offset may be utilized.

Additionally, it is possible to recognize the content of the entertainment sound signal and to calculate the self-adaptive gain offsets taking into account the recognized content of the sound signal. The use of content recognition is based upon findings that the auditory perception depends on the content of the entertainment sound signal. The perception is different for an entertainment signal being a speech signal and for the entertainment signal being a music signal. Accordingly, it might be recognized whether the entertainment sound signal contains speech content or music content. In the case where the entertainment sound signal has speech content, a self-adaptive speech gain offset may be provided used in connection with the adjustment of the announcement sound signal that is output in connection with the entertainment sound signal having the speech content. Additionally, the self-adaptive music gain offset may be provided that is used in connection with the adjustment of the announcement sound signal output in connection with the entertainment sound signal having a music content. Thus, it can be followed that upward of four adaptive gain offsets may be utilized. Two adaptive gain offsets for the calculation of the entertainment gain offset—one for a speech content and one for a music content of the entertainment sound signal—and, two self-adaptive gain offsets for determining the announcement gain offset—one for a music content and one for a speech content. However, it is also possible to use the self-adaptive gain offsets only for some of the applications.

Figure 4:
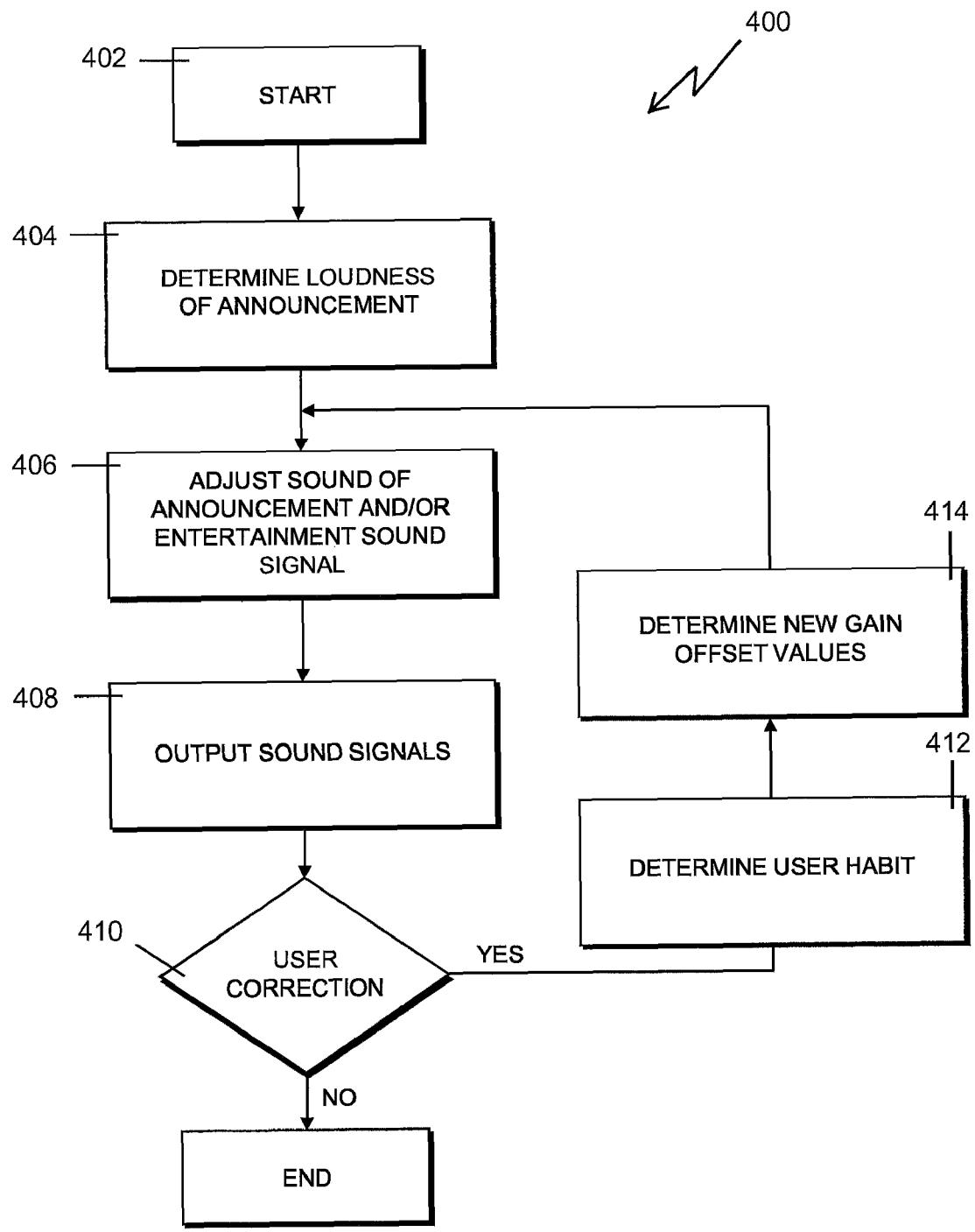
FIG. 4 show a flowchart of one example of a method to adapt the loudness of the announcement sound signal relative to the loudness of the entertainment sound signal using self-adaptive gain offsets.

FIG. 4 show a flowchart of one example of a method to adapt the loudness of the announcement sound signal relative to the loudness of the entertainment sound signal using self-adaptive gain offsets. In FIG. 4, the method starts in step 402. In the illustrated example, the loudness of the announcement sound signal is first determined in step 404. In step 406, the sound of the announcement and/or entertainment sound signal is adjusted as described in connection with FIG. 2 and the adjusted signal component are output in step 408. In step 410, it is asked whether the user has made any corrections to the output sound signal components. If this is not the case, it can be assumed that the gain offset values used in the gain offset tables lead to satisfying results. If, however, the user changed and corrected the signal output during the output of the entertainment and announcement sound signal, the kind of correction is determined in step 412. Based on the corrections made, it is possible to determine the self-adaptive gain offset values in step 414. These newly determined gain offset values are then used for the next announcement. As such, a feedback control mechanism is obtained. In the illustrated example, every time the user carries out a correction of the signal output, the corresponding information is used in the auditory habits determination unit 216 (FIG. 1). The more corrections were made, the better the auditory habits determination unit 216 can model how the user perceives the different sound signals.

It will be understood, and is appreciated by persons skilled in the art, that one or more processes, sub-processes, or process steps described in connection with FIGS. 1-4 may be performed by a combination of hardware and software. The software may reside in software memory internal or external to the signal processor or other controller, in a suitable electronic processing component or system such as, one or more of the functional components or modules schematically depicted in FIGS. 1 and 2. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any tangible computer-readable medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" is any means that may contain, store, communicate, propagate, or transport the program for use by or in connection with the instruction execution system, apparatus, or device. The computer readable medium may selectively be, for example, but is not limited to, an electronic, magnetic, optical, electromagnetic, infrared, or semiconductor system, apparatus, device, or medium. More specific examples, but nonetheless a non-exhaustive list, of computer-readable media would include the following: a portable computer diskette (magnetic), a RAM (electronic), a read-only memory "ROM" (electronic), an erasable programmable read-only memory (EPROM or Flash memory) (electronic), and a portable compact disc read-only memory "CDROM" (optical) or similar discs (e.g. DVDs and Rewritable CDs). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A method for adjusting a loudness of an announcement sound signal relative to a loudness of an entertainment sound signal, the method comprising the following steps:
   determining the loudness of the entertainment sound signal; and
   adjusting the loudness of the announcement sound signal relative to the entertainment sound signal using a self-adaptive gain offset of the announcement sound signal relative to the entertainment sound signal, the self-adaptive gain offset having a value that adapts in time to the auditory perception of a user to which the entertainment sound signal and the announcement sound signal are output.

2. The method of claim 1, where the self-adaptive gain offset contains table values adapting in time as a consequence of a learning process following previously performed user volume adjustments.

3. The method of claim 1, where the self-adaptive gain offset adapts by taking into account a former gain offset value and a correction of the volume made by the user when the announcement and the entertainment sound signal were output to the user using the former gain offset value.

4. The method of claim 2, where the self-adaptive gain offset adapts by weighting several factors, a new gain offset value is calculated based on the weighting, where the factors are selected form at least one of the following factors: the correction of the volume made by the user, a former gain offset value, a psychoacoustic model of human hearing.

5. The method of claim 1, where at least one gain offset table is provided containing the self-adaptive gain offset values depending on the loudness of the entertainment sound signal and depending on a volume level set by a user.

6. The method of claim 1, where the self-adaptive gain offset is calculated using an artificial neural network.

7. The method of claim 6, where an input variable of the artificial neural network is the correction of the user, whereas the output variable of the artificial neural network is the new self adaptive gain offset value.

8. The method of claim 1, where a self-adaptive announcement gain offset for the announcement sound signal and a self-adaptive entertainment gain offset for the entertainment sound signal are calculated.

9. The method of claim 1, where the content of the entertainment sound signal is recognized, and the self-adaptive gain offset is calculated taking into account the recognized content of the sound signal.

10. The method of claim 9, where the content is recognized by recognizing whether the entertainment sound signal contains speech content or music content, where a self-adaptive speech gain offset is used in connection with the adjustment of the announcement sound signal output in connection with the entertainment sound signal having a speech content, and a self-adaptive music gain offset is used in connection with the adjustment of the announcement sound signal output in connection with the entertainment sound signal having music content.

11. A sound signal adjusting system for adjusting a loudness of an announcement sound signal relative to a loudness of an entertainment sound signal, the system comprising:
   an entertainment loudness determination unit configured to determine the loudness of the entertainment sound signal;
   a gain offset determination unit configured to determine a self-adaptive gain offset of the announcement sound signal relative to the entertainment sound signal; and an auditory perception determination unit configured to determine the auditory perception of a user of the adjusting system, where the self-adaptive gain offset determination unit adapts the self-adaptive gain offsets over time in accordance with the determined auditory perception as a learning process following previous user volume adjustments:

12. The sound signal adjusting system of claim 11, where the gain offset determination unit comprises an announcement gain determination unit determining self-adaptive announcement gain offset values, and an entertainment gain determination unit determining self-adaptive entertainment gain offset values.

13. The sound signal adjusting system of claim 11, where the gain offset determination unit comprises gain offset tables containing the self-adaptive gain offset values depending on the loudness of the entertainment sound signal and depending on a volume level set by the user of the sound signal adjusting system.

14. The sound signal adjusting system of claim 13, where an entertainment gain offset table is provided comprising the self-adaptive gain offset values for the entertainment sound signal, and an announcement gain offset table comprising the self-adaptive gain offset values for the announcement sound signal.

15. The sound signal adjusting system of claim 11, where the auditory perception determination unit comprises an artificial neural network determining the self-adaptive gain offset values.

16. The sound signal adjusting system of claim 11, further comprising a content recognition unit recognizing the content of the entertainment sound signal, the gain determination unit determining the gain offsets depending in the recognized content of the entertainment sound signal.

17. The sound signal adjusting system of claim 16, where the content recognition unit recognizes whether the entertainment sound signal contains speech content or music content, where the entertainment gain offset determination unit comprises an entertainment gain offset table for speech content of the entertainment sound signal, and an entertainment gain offset table for music content of the entertainment sound signal.

18. The sound signal adjusting system of claim 16, where the content recognition unit recognizes whether the entertainment sound signal contains a speech content or a music content, where the announcement gain offset determination unit comprises an announcement gain offset table for speech content of the entertainment sound signal, and an announcement gain offset table for music content of the entertainment sound signal.

19. Gain offset determination unit for adjusting a loudness of an announcement sound signal relative to a loudness of an entertainment sound signal comprising gain offset tables containing the self-adaptive gain offset values depending on the loudness of the entertainment sound signal and depending on a volume level set by the user of the gain determination unit the self-adaptive gain offsets adapting in accordance with an auditory perception of an user of the gain determination unit taking into account previous volume user adjustments.

20. The gain offset determination unit of claim 19, further comprising an entertainment gain offset table for speech content of the entertainment sound signal, and an entertainment gain offset table for music content of the entertainment sound signal, both offset tables containing self-adaptive gain offset values.

21. The gain offset table of claim 19, where the gain offset tables include an announcement gain offset table for speech content of the entertainment sound signal, and an announcement gain offset table for music content of the entertainment sound signal, both offset tables containing self-adaptive gain offset values.

* * * * *